(12) United States Patent
McKee et al.

(10) Patent No.: US 7,830,437 B2
(45) Date of Patent: Nov. 9, 2010

(54) HIGH FILL FACTOR MULTI-WAY SHARED PIXEL

(75) Inventors: Jeffrey A. McKee, Meridian, ID (US); Joey Shah, Boise, ID (US)

(73) Assignee: Aptina Imaging Corp., Grand Cayman (KY)

( * ) Notice: Subject to any disclaimer, the term of this patent is extended or adjusted under 35 U.S.C. 154(b) by 1548 days.

(21) Appl. No.: 11/126,275

(22) Filed: May 11, 2005

(65) Prior Publication Data
US 2006/0256221 A1 Nov. 16, 2006

(51) Int. Cl.
*H04N 3/14* (2006.01)
*H04N 5/335* (2006.01)

(52) U.S. Cl. ...................... 348/302; 348/296

(58) Field of Classification Search ........... 348/302, 348/294, 296
See application file for complete search history.

(56) References Cited

U.S. PATENT DOCUMENTS

| | | | |
|---|---|---|---|
| 5,955,753 A | 9/1999 | Takahashi | |
| 5,962,844 A | 10/1999 | Merrill et al. | |
| 6,107,655 A | 8/2000 | Guidash | |
| 6,160,281 A | 12/2000 | Guidash | |
| 6,218,656 B1 | 4/2001 | Guidash | |
| 6,352,869 B1 | 3/2002 | Guidash | |
| 6,423,994 B1 | 7/2002 | Guidash | |
| 6,486,913 B1 | 11/2002 | Afghahi et al. | |
| 6,552,322 B1 | 4/2003 | Campbell et al. | |
| 6,552,323 B2 | 4/2003 | Guidash et al. | |
| 6,657,665 B1 | 12/2003 | Guidash | |
| 6,731,335 B1 | 5/2004 | Kim et al. | |
| 6,947,088 B2 | 9/2005 | Kochi | |
| 6,977,684 B1 | 12/2005 | Hashimoto et al. | |
| 7,443,437 B2* | 10/2008 | Altice et al. | 348/296 |
| 2003/0128147 A1* | 7/2003 | Huang et al. | 341/155 |
| 2004/0159861 A1 | 8/2004 | Mori et al. | |
| 2004/0251394 A1 | 12/2004 | Rhodes et al. | |
| 2005/0012168 A1* | 1/2005 | Hong | 257/428 |
| 2005/0167574 A1 | 8/2005 | He et al. | |

FOREIGN PATENT DOCUMENTS

| | | |
|---|---|---|
| EP | 0 954 032 A2 | 11/1999 |
| JP | 5-207376 | 8/1993 |

(Continued)

OTHER PUBLICATIONS

International Search Report and Written Opinion dated Mar. 16, 2007.
Hisanori Ihara, et al., "A 3.7×3.7μm2 Square Pixel CMOS Image Sensor for Digital Still Camera Application", pp. 182-183, Toshiba Corp., Kawasaki, Japan.

(Continued)

*Primary Examiner*—Kelly L Jerabek
(74) *Attorney, Agent, or Firm*—Dickstein Shapiro LLP (57) ABSTRACT

A pixel cell array architecture having a multiple pixel cells with shared pixel cell components. The individual pixel cell architecture increases the fill factor and the quantum efficiency for the pixel cell. The common pixel cell components may be shared by a number of pixels in the array, and may include several components that are associated with the read-out of a signal from the pixel cell. Other examples of the pixel array architecture having improved fill factor for pixels in the array include an angled transfer gate and an efficiently located, shared capacitor.

28 Claims, 11 Drawing Sheets

FOREIGN PATENT DOCUMENTS

| | | |
|---|---|---|
| KR | 1999-23548 | 3/1999 |
| KR | 1999-83635 | 11/1999 |
| WO | WO 2004/047428 | 3/2004 |

OTHER PUBLICATIONS

Korean Office Action 10-2007-7028831 dated May 28, 2009 w/ English translation (12 pages).

* cited by examiner

HIGH FILL FACTOR MULTI-WAY SHARED PIXEL

FIELD OF THE INVENTION

The present invention relates generally to digital image sensors and in particular to a pixel cell array architecture having shared components among pixel cells of the array.

BACKGROUND OF THE INVENTION

Typically, a digital imager array includes a focal plane array of pixel cells, each one of the cells including a photosensor, e.g. a photogate, photoconductor, or a photodiode. In a CMOS imager a readout circuit is connected to each pixel cell which typically includes a source follower output transistor. The photosensor converts photons to electrons which are typically transferred to a floating diffusion region connected to the gate of the source follower output transistor. A charge transfer device (e.g., transistor) can be included for transferring charge from the photosensor to the floating diffusion region. In addition, such imager cells typically have a transistor for resetting the floating diffusion region to a predetermined charge level prior to charge transference. The output of the source follower transistor is gated as a pixel output signal by a row select transistor.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, each assigned to Micron Technology, Inc. The disclosures of each of the forgoing patents are hereby incorporated by reference in their entirety.

Figure 1:
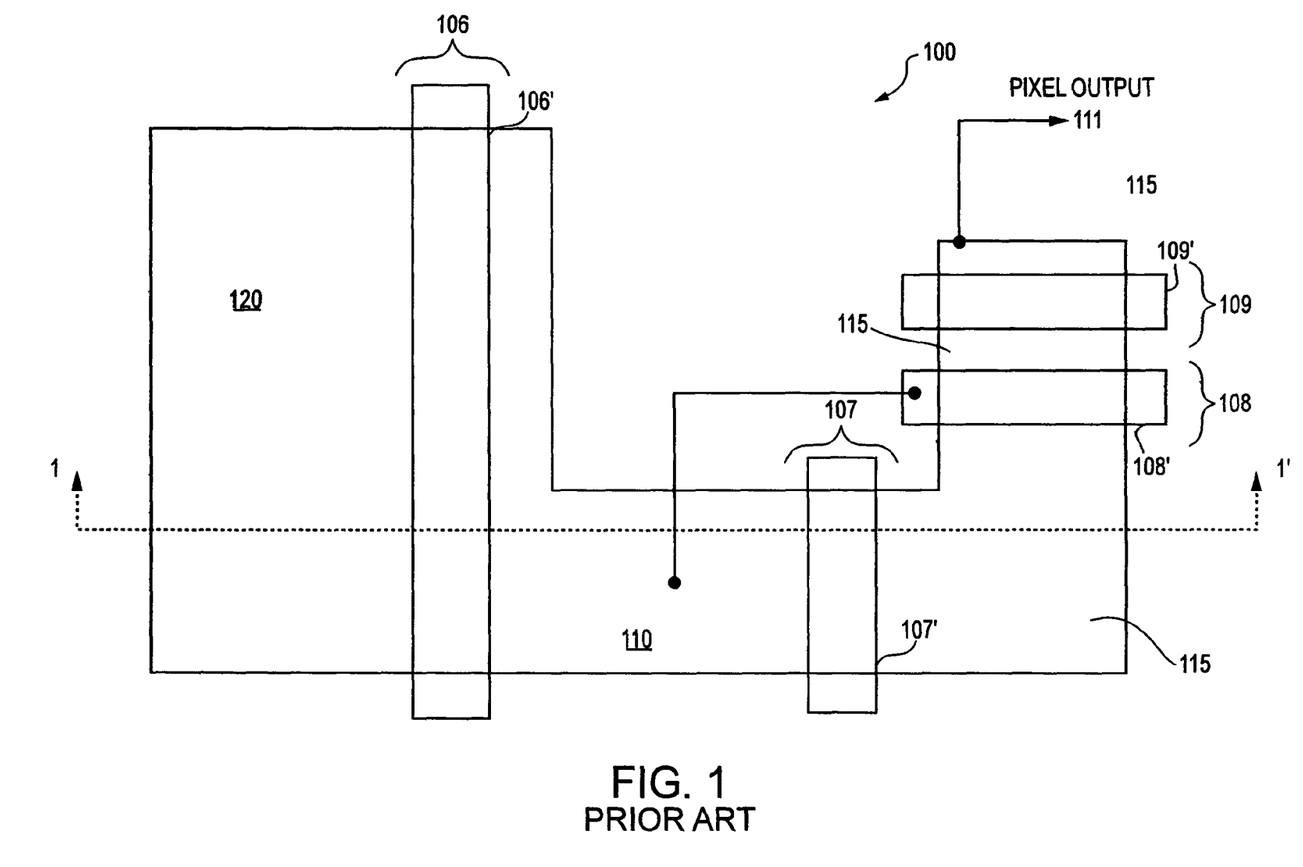
FIG. 1 is a top-down view of a conventional CMOS pixel cell.
Figure 2:
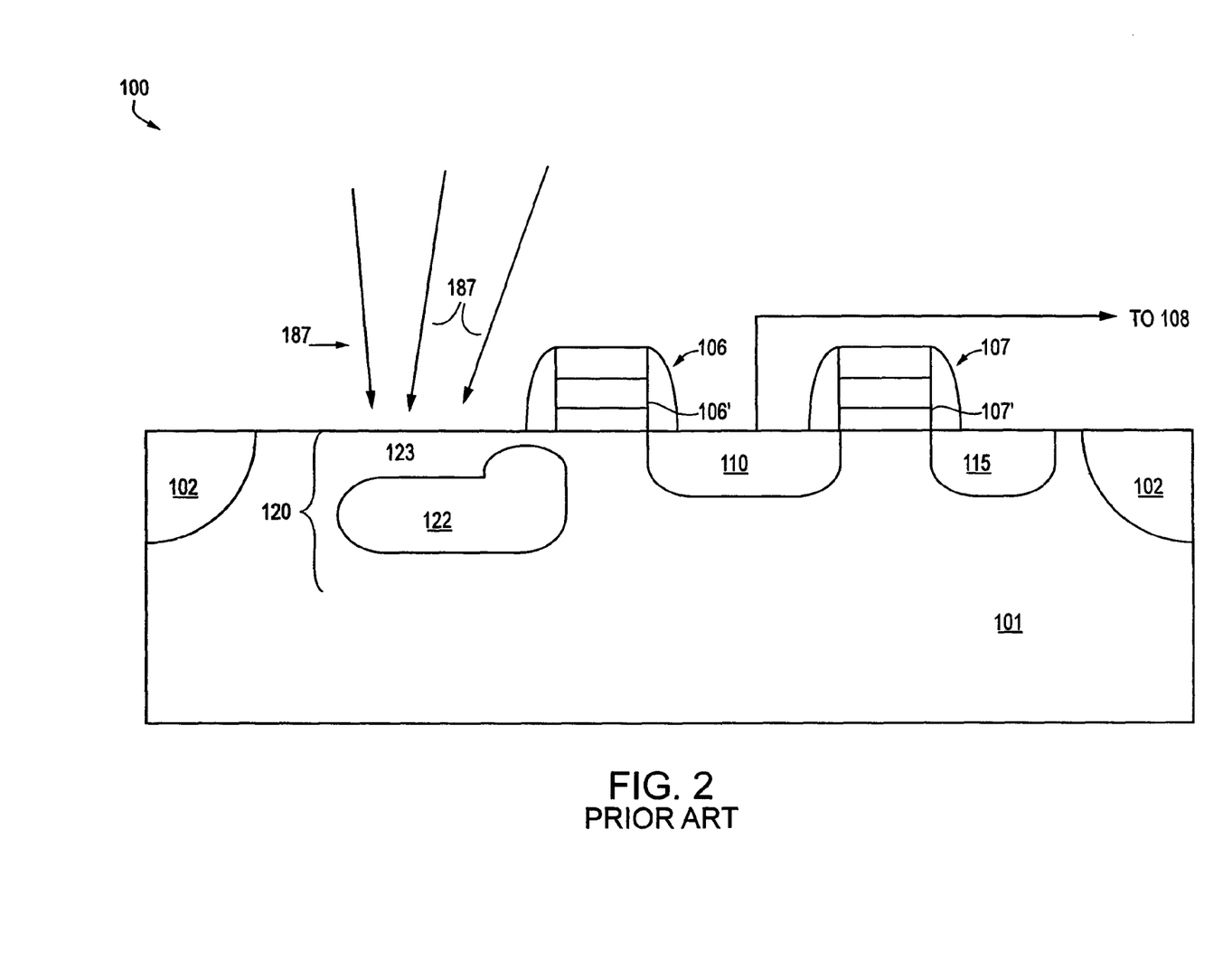
FIG. 2 is a cross-sectional view of the pixel cell of FIG. 1, taken along line 1-1'.
Figure 3:
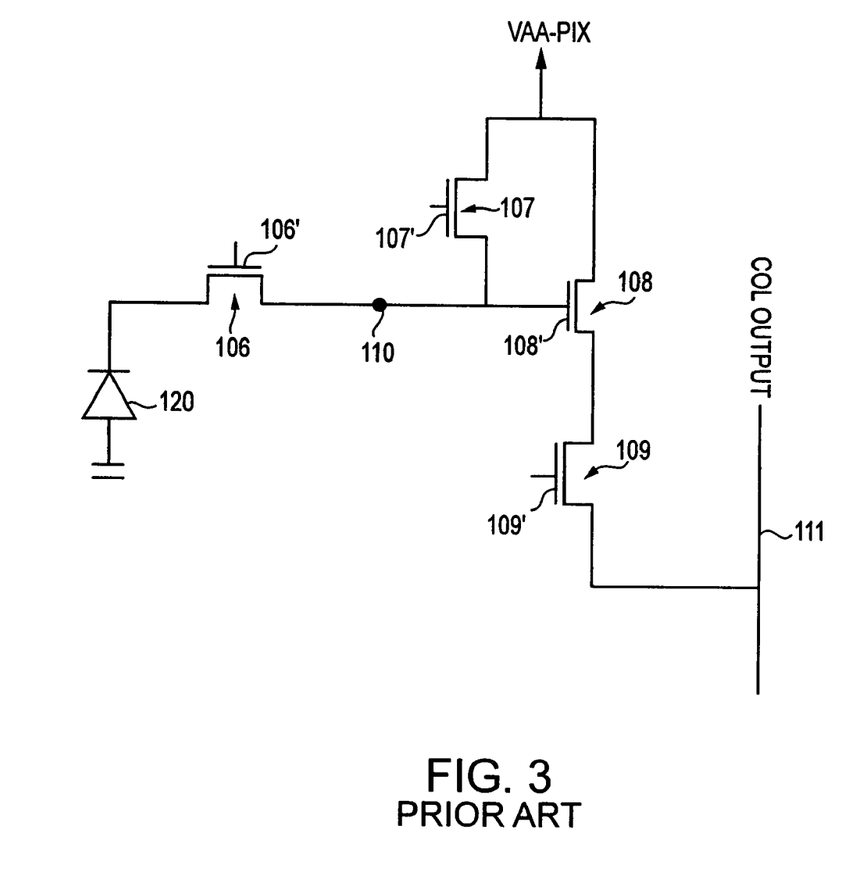
FIG. 3 is a circuit diagram of the conventional pixel cell of FIGS. 1 and 2.

With reference to FIGS. 1, 2 and 3, which respectively illustrate a top-down view, a cross-sectional view and electrical circuit schematic of a conventional CMOS pixel sensor cell 100 when incident light 187 strikes the surface of a photodiode photosensor 120, electron/hole pairs are generated in the p-n junction of the photodiode (represented at the boundary of n− accumulation region 122 and p+ surface layer 123). The generated electrons (photo-charges) are collected in the n-type accumulation region 122 of the photodiode 120. The photo-charges move from the initial charge accumulation region 122 to a floating diffusion region 110 via a transfer transistor 106. The charge at the floating diffusion region 110 is typically converted to a pixel output voltage by a source follower transistor 108 and subsequently output on a column output line 111 via a row select transistor 109.

Conventional CMOS imager designs, such as that shown in FIGS. 1 and 2 for pixel cell 100, provide only approximately a fifty percent fill factor, meaning only half of the pixel 100 is utilized in converting light to charge carriers. As shown, only a small portion of the cell 100 comprises a photosensor (photodiode) 120. The remainder of the pixel cell 100 includes the isolation regions 102, shown as STI regions in a substrate 101, the floating diffusion region 110 coupled to a transfer gate 106' of a transfer transistor 106, and source/drain regions 115 for reset 107, source follower 108, and row select 109 transistors having respective gates 107', 108', and 109'. Moreover, as the total pixel area continues to decrease (due to desired scaling), it becomes increasingly important to create high sensitivity photosensors that utilize a minimum amount of surface area or to find more efficient layouts on the pixel array for the non-photosensitive components of the pixel cells to provide increased photosensor areas.

In addition, conventional storage nodes, such as floating diffusion region 110, have a limited amount of charge storage capacity. Once this capacity is reached, a pixel cell becomes less efficient. Once the charge storage capacity is exceeded, an undesirable phenomenon occurs, whereby the "over-capacity" charges escape to undesirable parts of the pixel cell 100 or to adjacent pixel cells. One suggested solution for dealing with this limited charge storage capacity is to utilize a capacitor which is connected with the floating diffusion region. The problem with this solution, however, is that a capacitor on a pixel cell takes up space that could otherwise be used to increase the size of the photosensor, thereby decreasing the potential fill factor for the pixel cells and overall array.

Accordingly, there is a desire for an efficient pixel cell array architecture which has an improved fill factor and charge storage capacity.

BRIEF SUMMARY OF THE INVENTION

The present invention, in the various exemplary embodiments, provides a pixel cell array architecture having multiple pixel cells with shared pixel cell components. The pixel cell architecture increases the potential fill factor, and in turn, the quantum efficiency of the pixel cell array. The common pixel cell components may be shared by a number of pixels in the array, and may include several components that are associated with the readout of a signal from the pixel cells.

In accordance with exemplary embodiments of the invention, the pixel cell architecture includes a transfer gate which is angled with respect to the pixel cell's photosensor. In yet other exemplary embodiments, a storage capacitor is suitably located such that it can be shared by multiple pixel cells to increase the charge capacity of the pixel cells, while maintaining a high fill factor.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, epitaxial, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor and associated transistors for converting photons to an electrical signal. For purposes of illustration, a small number of representative pixels are illustrated in the figures and description herein; however, typically fabrication of a large plurality of like pixels proceeds simultaneously. Accordingly, the following detailed description is not to be taken in a limiting sense, and the scope of the present invention is defined only by the appended claims.

The terms "at an angle," "angled," and "slanted," as used herein are to be interpreted as meaning at any angle, with respect to some stated reference point, that is not exactly parallel or exactly perpendicular. Accordingly, when at least a portion of an object and some reference point meet to form an angle that is not 0°, 90°, or 180°, the object is considered "angled," "at an angle," or "slanted" with respect to the reference point.

Figure 4:
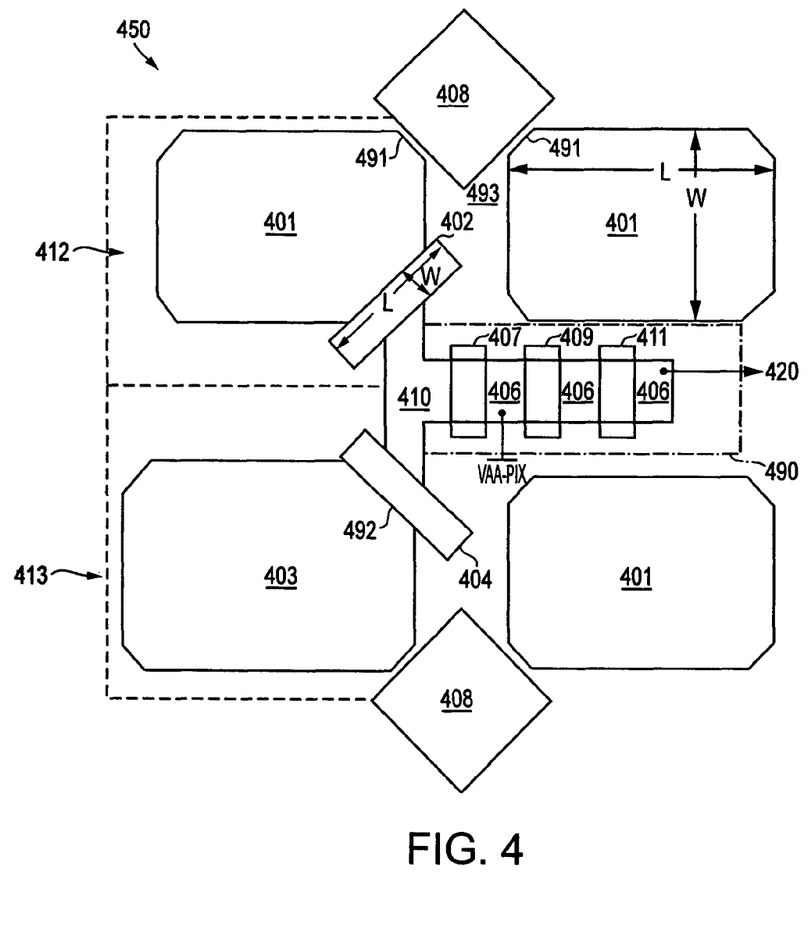
FIG. 4 is a top-down view of a portion of a pixel cell array constructed in accordance with a first exemplary embodiment of the invention.
Figure 5:
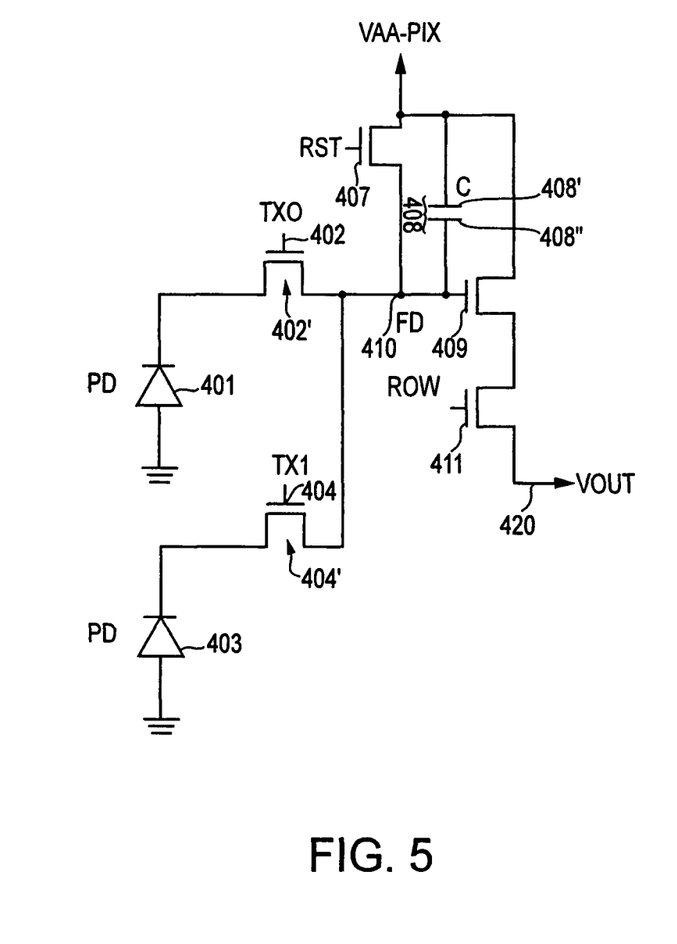
FIG. 5 is a circuit diagram of a portion of a pixel cell array constructed in accordance with the first exemplary embodiment of the invention.

Now referring to the figures, where like numerals designate like elements, FIG. 4 illustrates a top-down view of a portion of a pixel array 450 constructed in and over a silicon substrate with a pixel layout design in accordance with a first exemplary embodiment of the present invention. FIG. 5 is a circuit diagram depicting portions of the FIG. 4 pixel array 450.

In the illustrated portion of pixel array 450, two adjacent pixels 412, 413 in one column of the array 450 share common pixel components. In addition, each pixel cell 412, 413 has an individual photosensor 401, 403, respectively. The photosensors 401, 403 may be any photosensitive structure for converting light photons into electrons (photo-charges), and in a preferred embodiment the photosensors 401, 403 are photodiode regions. Each pixel cell 412, 413 may have a respective transfer gate 402, 404 as part of a respective transfer transistor 402', 404' for transferring the accumulated photo-charges from the photosensors 401, 403 to a common storage node, shown as floating diffusion region 410.

Preferably, the transfer gates 402, 403, are angled from the photosensors 401, 403. For example, the longitudinal extent of the transfer gates 402, 403 is shown as being slanted with respect to the length L and the width W of the associated photosensors 401, 403. This preferred angled geometry of the transfer gate 402 allows for an efficient layout of the length L and width W of the transfer gate, to improve the leakage and lag performance of the pixel 412 (413). In addition, this angled layout is also beneficial in maximizing the fill factor of the pixel cell 412 (413), by maximizing the area of the photosensor 401 for each pixel 412 (413).

The remaining pixel components are shared between the adjacent pixels 412, 413 as shown in FIGS. 4 and 5. These components are illustrated as being on a shared trunk 490, which is located between two row-adjacent photosensors 401, 403 in a next pixel column of the array. The shared components on the trunk 490 include the floating diffusion region 410, which serves as a common storage node for the pixels 412, 413, receiving charges from photosensors 401, 403 by the transfer gates 402, 404. A reset transistor having a gate 407 is located on a side of the floating diffusion region 410 opposite the photosensors 401, 403. A source/drain region 406 is located on a second side of the reset transistor gate 407 which is capable of receiving a supply voltage $V_{aa\text{-}pix}$. The floating diffusion region 410 is also electrically connected to the gate 409 of a source follower transistor, which has a drain coupled to the supply voltage $V_{aa\text{-}pix}$. The source follower transistor creates a voltage output signal based on stored charge on the floating diffusion region 410. A row select transistor having a gate 411 has a drain connected to the source of the source follower transistor, for selectively reading out the pixel signal to a column line 420.

As shown in electrical schematic form in FIG. 5, a shared capacitor 408 has a first electrode 408', which may be coupled to $V_{aa\text{-}pix}$ and is electrically connected at a second electrode 408" to the floating diffusion region 410. The capacitor 408 increases the charge storage capacity of the floating diffusion region 410 and the quantum efficiency of the pixels 412, 413. The capacitor 408 is preferably electrically connected to the floating diffusion region 410 and $V_{aa\text{-}pix}$ by way of metallization layers (not shown) above the surface of the pixel array 450. Alternatively, the capacitor 408 can be connected to a diffusion region 410 and/or $V_{aa\text{-}pix}$ via a buried, conductive interconnect layer located just under a surface of the substrate. A preferred layout for the pixel array 450 has the shared capacitor 408 located at the corners of two column adjacent photosensor regions 401, 403 as illustrated. The corners 491 of the photosensor pair 401, 403 are formed at a slightly clipped angle to permit this architecture. A second pair of photosensors (not shown) adjacent the first pair of photosensor's 401, 403 would also have clipped edges such that the capacitor 408 is formed in the area between four photosensors. As shown, the photosensor's 401, 403 corners do not form right angles where the length L and width W of the photosensors 401, 403 meet. Rather, the photosensor edge 491 is at a clipped angle taking a small area of the photosensitive area away to allow for the capacitor 408. This preferred design maximizes the capacitor area while minimizing loss of photosensor 401 (403) area. An appropriate isolation technique, e.g., shallow trench isolation, would be used to form an isolation region 493 to isolate the capacitor 408 from the four photosensors. Although there are two capacitors 408 shown in FIG. 4, only one capacitor 408 is shared by pixels 412, 413, as shown in FIG. 5; the other capacitor 408 is shared between two other row adjacent pixels (not shown) in array 450.

Figure 6:
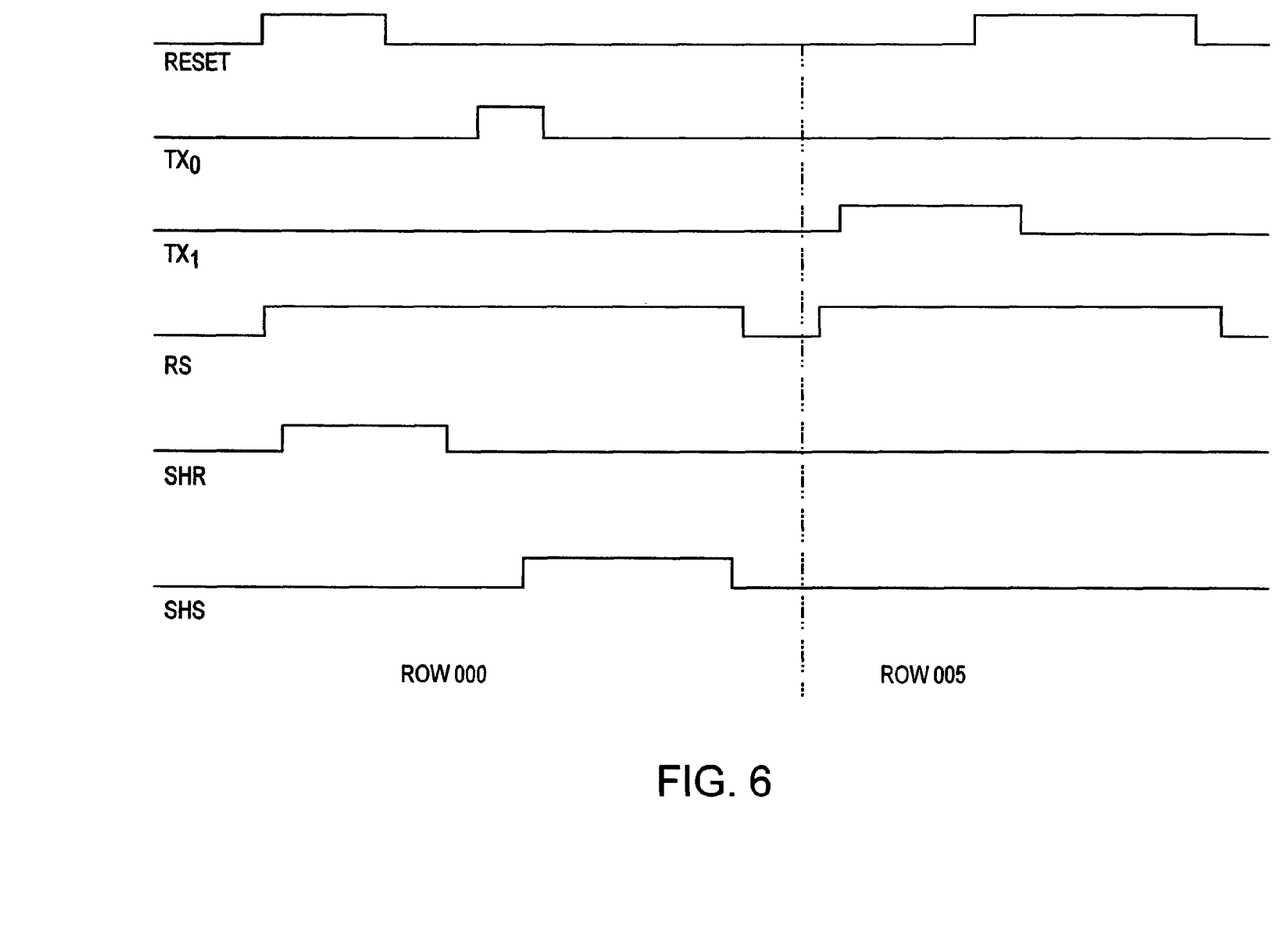
FIG. 6 is a timing diagram depicting an exemplary method for operating a pixel cell array constructed in accordance with the first embodiment of the invention.
Figure 10:
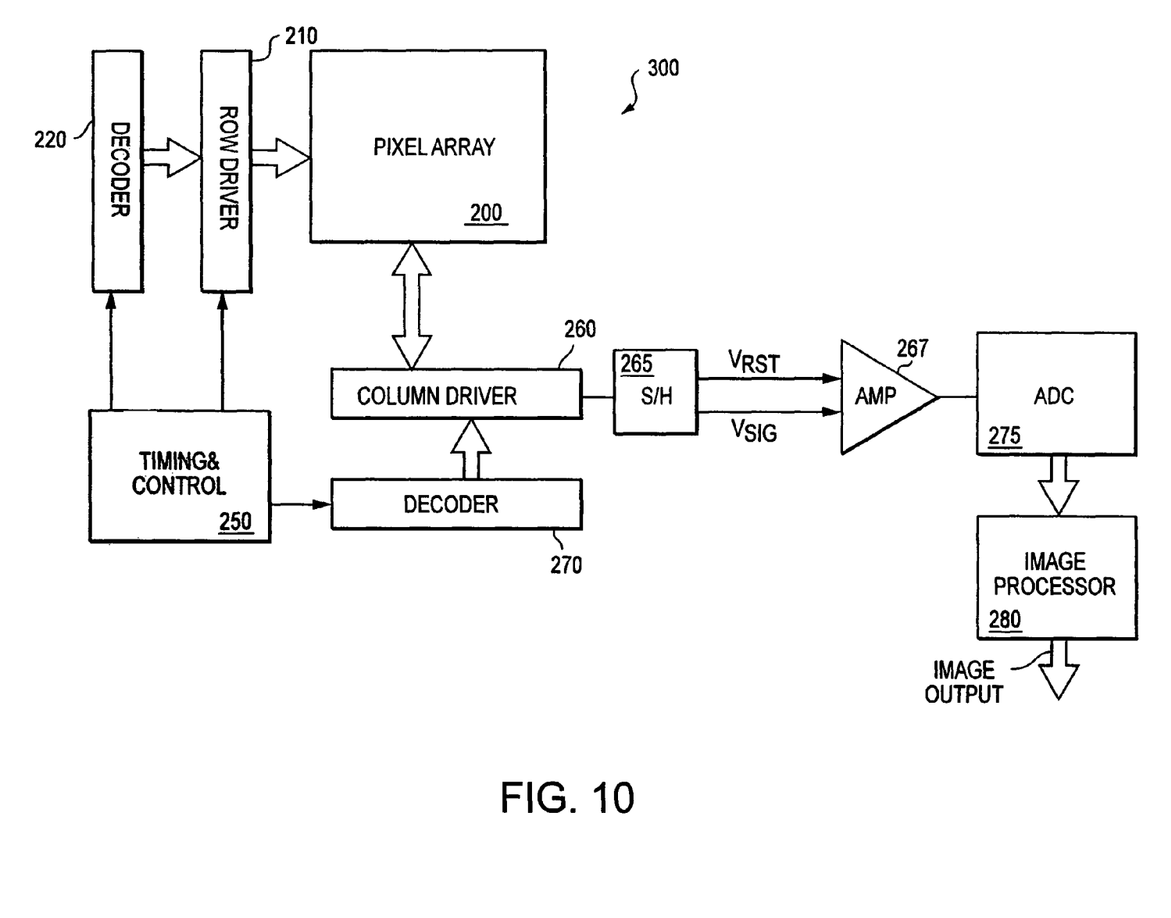
FIG. 10 is a block diagram of a CMOS imager chip having an array of pixel cells constructed in accordance with the invention.

Turning to FIG. 6, an exemplary method of operating the pixel array 450 is now described with further reference to FIG. 10, a block diagram of a CMOS imager 300 incorporating the pixel array 200 based on exemplary array 450. The exemplary method of operation employs a rolling shutter feature, however, it should be understood that the invention is in no way limited to the exemplary methods of operation as described herein. For the method depicted in FIG. 6, the exposure (integration) time for the array 450 is five rows. Thus, the end of an integration period for a first row (Row 000) and the start of an integration period for a sixth row (Row 005) are shown in FIG. 6, separated by the dashed line representing a row address for the rolling shutter.

At the end of an integration period, the readout operation begins for pixels in Row 000. This readout process will be described for exemplary pixel 412, but it should be understood that it is occurring simultaneously for each of the pixels in this row. The readout begins with the timing and control circuitry 250 (FIG. 10) pulsing a reset signal (Reset) high to activate the reset transistor 407. The timing and control circuitry 250 also sends the row select signal (RS) high activating the gate 411 of row select transistor. The pulsing of a sample hold reset signal (SHR) initiates a sampling and holding of the reset voltage $V_{rst}$ at a sample and hold circuit 266 (FIG. 10) on a column line through a source follower transistor 409 and the activated row select transistor 411. As a result, a reset voltage $V_{rst}$ appears as the pixel output on a column line. Next, timing and control circuitry 250 pulses a transfer signal ($TX_0$) to activate transfer transistor 402'. While $TX_0$ is high, any charges accumulating at the photosensor 401 in response to applied light, during the integration period, are transferred through transfer transistor 402' onto the floating diffusion region 410. Thus, the amount of charge stored in the floating diffusion region 410 (and on the associated capacitor 408) represents the amount of external light incident on the pixel cell 412. Timing and control circuitry 250 pulses a sample and hold photo signal (SHS) high to cause the sample and hold circuitry 265 to read out the resulting photo signal output voltage $V_{sig}$ for the pixel cell 412. A differential signal ($V_{rst}$-$V_{sig}$) for pixel cell 412 is then generated by the differential amplifier 267 (FIG. 10) and processed by other circuitry as explained below.

The operation for pixels in a sixth row, Row 005, at this time includes the initiation of an integration period. Timing and control circuitry 250 (FIG. 10) activates the pixels in this sixth row (Row 005) by applying an appropriate row select signal, which is shown in FIG. 6 as RS and should be understood to be a different signal than that for the first row discussed above. In order to reset the charge at the photosensor, such as photosensor 401, the transfer gate associated with the photosensor in Row 005 is activated by the timing and control circuitry sending the transfer gate signal, shown here as $TX_1$ for this row, to high. Additionally, as the transfer gate signal $TX_1$ remains high, the reset gates in this row are also activated by an appropriate signal (Reset) from the control circuitry 250. This causes any residual charges in the photosensor to drain to the reset voltage supply. When these signals ($TX_1$ and Reset) return to low, an integration period for this row of pixels begins.

The readout process for Row 001 is the same as for Row 000 as shown in FIG. 6, except that the transfer control signal $TX_1$ goes high, instead of $TX_0$, to turn on the transfer gates for Row 001. When the readout of the pixels in Row 001 is completed, the resetting of pixels in Row 006 to begin an integration period begins and follows the process described for Row 005, except transfer control signal $TX_0$, instead of $TX_1$, goes to high to reset the photosensors in Row 006.

Figure 7:
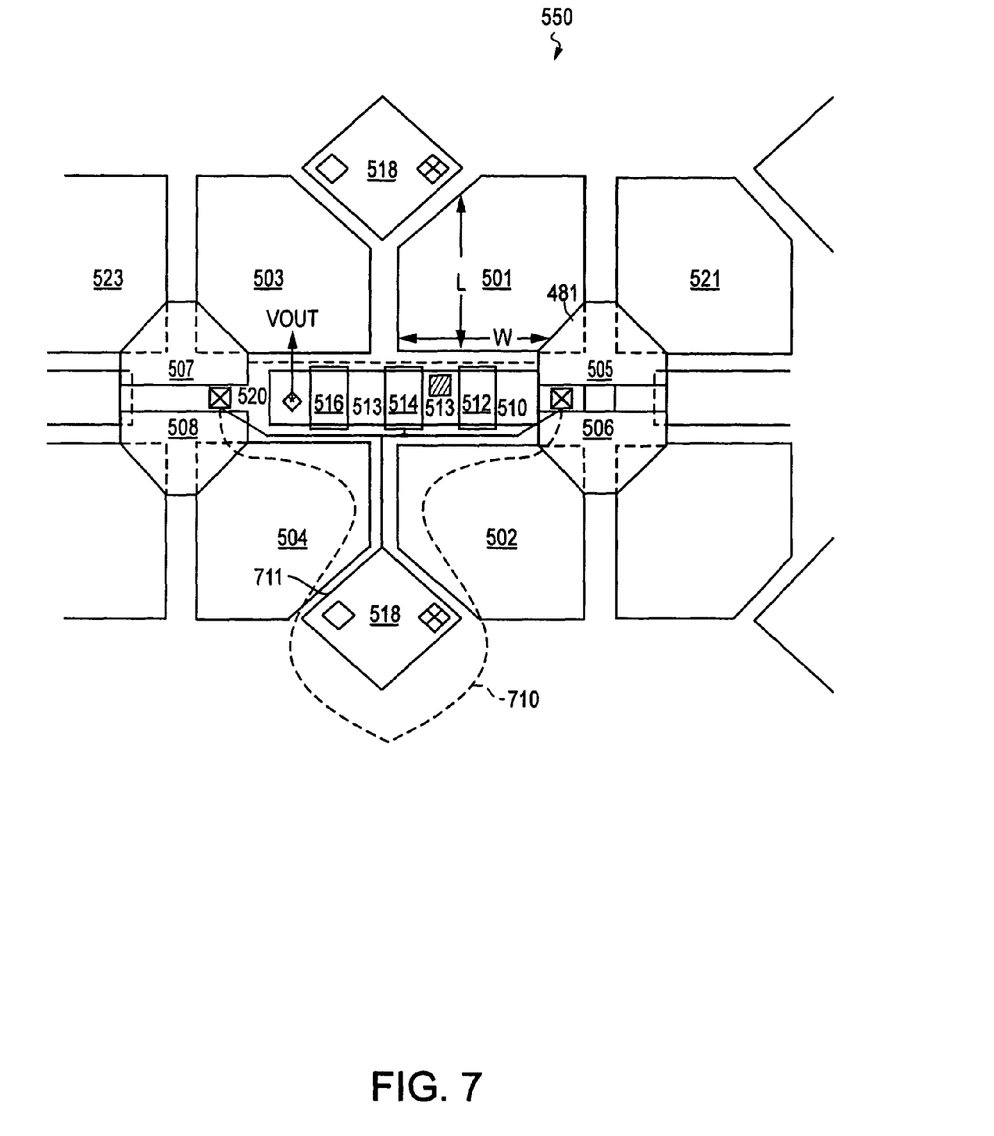
FIG. 7 is a top-down view of a portion of a pixel cell array constructed in accordance with a second exemplary embodiment of the invention.
Figure 8:
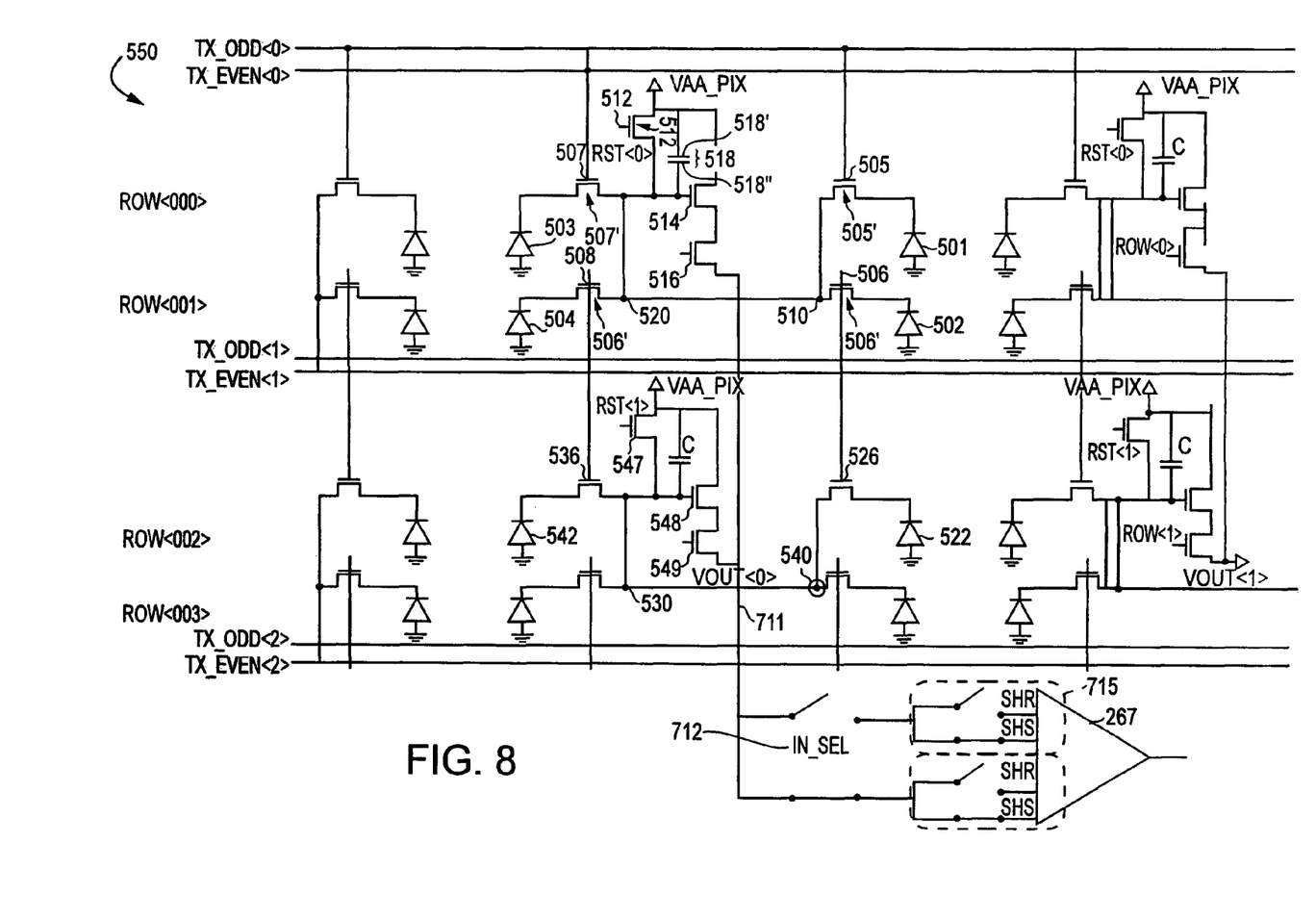
FIG. 8 is a circuit diagram of a portion of a pixel cell array constructed in accordance with the second exemplary embodiment of the invention that is to be operated in accordance with a first exemplary method of operation.

Turning to FIGS. 7 and 8 a second exemplary embodiment of the invention is now described. FIG. 7 shows a top-down view of a portion of the pixel array 550 while FIG. 8 is a circuit diagram depicting portions of the exemplary pixel array 550 in exemplary electronic schematic form. In accordance with the second exemplary embodiment of the invention, the pixel array 550 architecture includes 4-way sharing of pixel components among individual pixel cells having respective photosensors 501, 502, 503, 504. These four pixels have a shared architecture shown by dotted lines area 710 in FIG. 7. The shared architecture includes a linearly-extending trunk located within the area between the pair of photosensors 501, 503 and the pair of photosensors 502, and 504.

As illustrated in FIG. 8, each pixel cell has a transfer transistor 505', 506' 507', 508' having an associated gate 505, 506, 507, 508. At least a portion of the transfer transistor gates 505, 506, 507, 508 are preferably at an angle 481 with respect to the photosensors 501, 502, 503, 504 as shown in FIG. 7. It should also be noted that the transfer transistor gates 505, 506, 507, 508 of this embodiment are being shared, each among two adjacent pixels in a column. For example, column adjacent pixel photosensors 501 and 521 each share the transfer gate 505 and column adjacent pixels 503, 523 share the transfer transistor gate 507. The two illustrated pixels (having associated photosensors 501, 521) that share a transfer transistor gate (505), however, do not share a floating diffusion region or readout circuit. Rather, this embodiment has two row adjacent pixels having photosensors 501 and 502 sharing a first floating diffusion region 510, and two row adjacent photosensors and 503, 504 sharing a second floating diffusion region 520. The two floating diffusion regions 510, 520 are electrically connected to one another and to one electrode 518" of an associated capacitor 518 through a first metallization layer formed above the surface of the pixel array 550. As shown in FIGS. 7 and 8, each capacitor 518 is connected at another side 518' to a contact receiving a source voltage, e.g., $V_{aa-pix}$, at source/drain region 513 through a second metallization layer.

One reset transistor 512' having a gate 512 is utilized for resetting the charges at both floating diffusion regions 510, 520 and the associated capacitor 518. To one side of the reset gate 512 is a source/drain region 513 that is capable of receiving a supply voltage $V_{aa-pix}$. The four pixel cells having associated photosensors 501, 502, 503, 504 share a common readout circuit that includes a source follower transistor having a gate 514 and a row select transistor having a gate 516. The four pixels also share the capacitor 518 which can increase the storage capacity of the two associated floating diffusion regions 510, 520.

The four-way shared pixel layout described herein illustratively has two row-adjacent pixels having respective photosensors 501, 502 (FIG. 7) and two column-adjacent pixels having respective photosensors 503, 504 sharing one set of readout circuitry 710. Thus, a column output line 711 is only necessary, in accordance with this exemplary embodiment, for every other column. Additionally, because two column adjacent pixels share a common transfer gate signal, as seen in FIG. 8, two column adjacent pixels in adjacent rows will be read onto the same output line 711 at nearly the same time. The respective signals from these pixels needs to be separately handled in order to maintain maximum resolution for the pixel array 550. As shown in FIG. 8, this means that each column output line 711 utilizes two sets of sample and hold capacitors 715, 716, or four capacitors total. A switch 712, activated by an in_sel signal (FIG. 9) is utilized to determine whether an incoming signal $V_{rst}$ or $V_{sig}$ should go into one of a first set of capacitors 715 or one of a second set of capacitors 716. The remaining control circuitry (discussed in detail below with reference to FIG. 10) produces a differential signal, for each pixel, from the signals stored in the sets of capacitors 715, 716 which is then output for further processing.

The illustrated, 4-way shared pixel array configuration has at least two distinct advantages: it allows for larger pitch circuits in the periphery in the column direction and it reduces the metallization layers needed in the layers above the surface of the pixel array 550 while increasing the photosensitive area and thus quantum efficiency over the conventional pixel array. In addition, each capacitor 518 is efficiently located at the corners of four photosensors, such as shown at the clipped edges 711 of photosensors 502, 504. This location allows for a maximized capacitor area without sacrificing photosensitive area, or thereby decreasing the fill factor of the pixels array 550.

Figure 9:
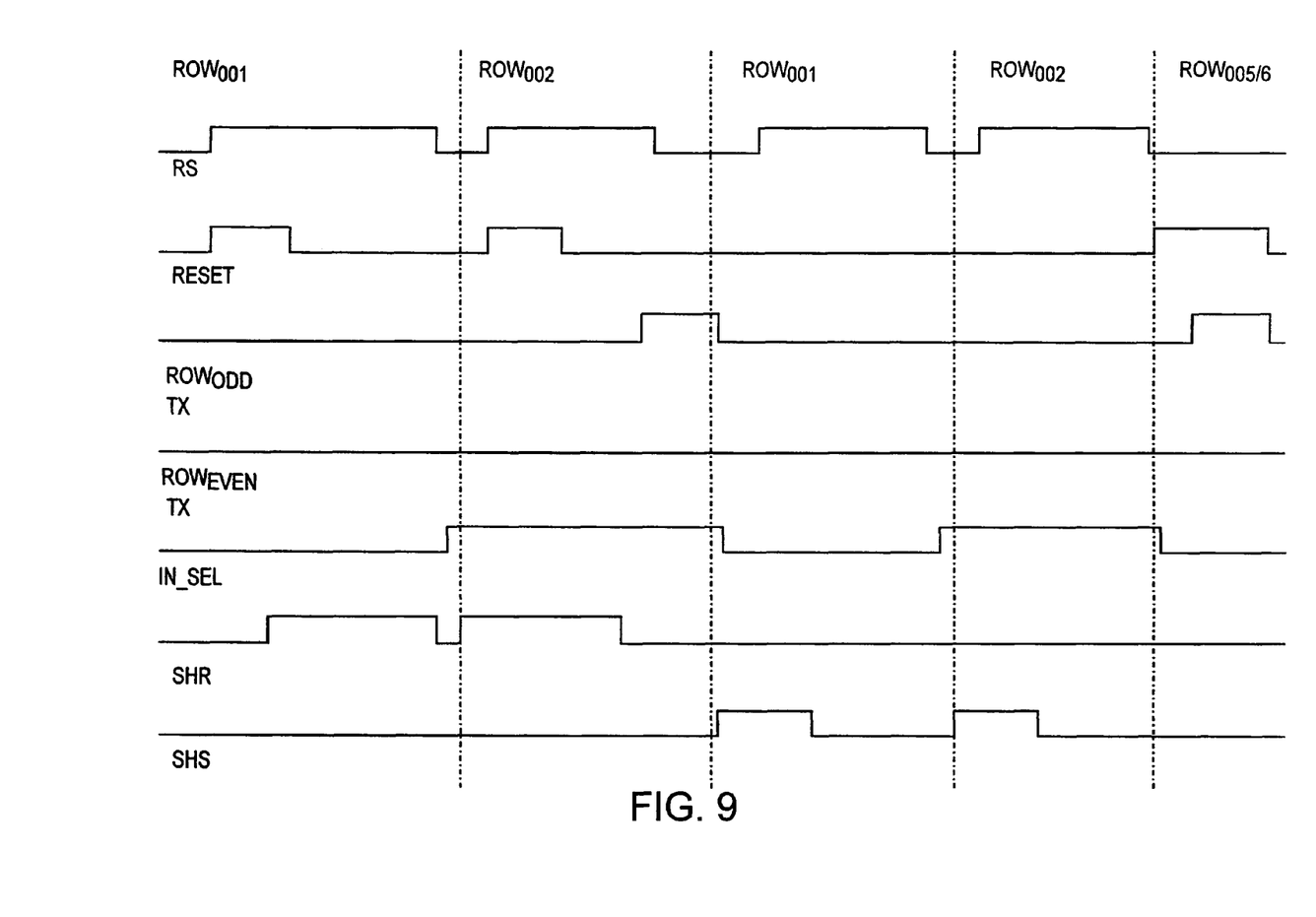
FIG. 9 is a timing diagram depicting the second exemplary method for operating a pixel cell array constructed in accordance with the second embodiment of the invention.

Turning to FIG. 9, one exemplary method of operating the pixel array 550 is now described with further reference to FIG. 8 and FIG. 10, a block diagram of a CMOS imager 300 having a pixel array 200 based on exemplary array 550. FIG. 9 illustrates a timing diagram for performing a portion of an exemplary method for operating the exemplary array 550 using a rolling shutter operation as discussed above with reference to FIG. 6. Specifically, FIG. 9 illustrates a readout of signals from two rows (Row <001> and Row <002>) of the pixel array 550, each row having an integration time of four rows. In addition, FIG. 9 shows the initiation of an integration period for two other rows in the array 550. It should be noted that the transfer gate signal lines TX_ODD<0>, TX_EVEN<0>, TX_ODD<1>, TX_EVEN<1>, etc., shown in FIG. 8, use nomenclature where ODD or EVEN represent the odd or even pixel columns in an array, while the designation "<no.>" represents a specific signal line row number in an array.

Reading from left to right in FIG. 9, a readout operation is performed for the pixels in Row 001, which should be understood is being performed after the appropriate integration period for this row. The timing and control circuitry 250 (FIG. 10) pulses an appropriate row select signal (RS) to high to enable the row select transistors of a particular row, for example, the row select signal RS for either Row <000> or Row <001> would turn "on" row select gate 516 (FIG. 8). Floating diffusion regions, such as floating diffusion region 520, in row 001 are reset by activation of a reset signal (Reset) which is pulsed high to activate the reset gate 512 of reset transistors in the row. With the row select signal (RS) high, a sample hold reset signal (SHR) is pulsed to initiate the readout of a pixel signal representing the reset condition, $V_{rst}$, which is taken from the floating diffusion region (520) through a source follower transistor (514) and row select transistor (516). An additional signal "in_sel" is either activated, i.e., pulsed to high, or not depending on which of an odd and even row is being read out to control the storage of the signal in the appropriate sample and hold circuits 715, 716, as discussed above. Each of the activated signals for Row <001> returns to low.

For row <002>, a similar readout operation is performed. Specifically, the appropriate row select signal (RS) is turned to high by the timing and control circuitry 250 (FIG. 10) to activate the row select transistors 549 for this row. Floating diffusion regions in row 002, such as floating diffusion regions 530, 540 (FIG. 8) are reset by activation of a reset signal (Reset) which is pulsed high to activate the reset gates 547 of reset transistors in the row. With the row select signal (RS) high, a sample hold reset signal (SHR) is pulsed to initiate the readout of a pixel signal representing the reset condition, $V_{rst}$, which is taken from the floating diffusion region 540 through a source follower transistor 548 and row select transistor 549. If the "in_sel" signal was low during the previous readout of row <001>, it should be switched to high during this readout, and vice versa. The reset signal (Reset) and reset sample and hold signal (SHR) return to low, as does the row select gate activation signal (RS).

Next, the transfer gates for the appropriate transfer transistors in Rows <001> and <002> are turned "on" for all odd columns by pulsing an appropriate transfer gate signal (Row$_{odd}$ TX) to high. As shown in FIG. 8, when a signal on line TX_odd<1> is pulsed, transfer gates 506 and 526 are turned "on" to respectively transfer charges from photosensors 502, 522 into floating diffusion regions 510, 540.

Turning to the second dashed line in FIG. 9, a pixel signal is now read out from every odd column pixel in Row <001>. While the appropriate row select transistor signal (RS) is high, a sample and hold signal (SHS) is pulsed to readout a pixel signal $V_{sig}$, from a floating diffusion region 510 through a source follower 514 and row select transistor 516 onto the column line 711. As above, the "in_sel" signal is either activated or not to control storage of the pixel signal with the appropriate sample and hold circuit capacitors 715, 716 (FIG. 8). For row <002>, the same readout step is next performed, activating a sample hold signal (SHS) and a row select signal (RS) to read out a pixel signal $V_{sig}$ from every other pixel in the row. For Row <002>, however, the "in_sel" signal will be in the opposite position as it was for reading out a signal onto column line 711 from the floating diffusion region 510 in Row <001>. At this point, pixel signals generated by photosensors 502 and 522 in Row <001> and Row<002> in odd columns have been read out.

It should be understood that the steps just described would then be repeated to readout a pair of signals $V_{rst}$ and $V_{sig}$ from the even column pixels in Rows <001> and <002>. Specifically, signals $V_{rst}$ and $V_{sig}$ would next be read out onto column line 711 and separately stored in sample and hold capacitors 715, 716 for photosensors 504, 542 and the respective floating diffusion regions 520, 530. The readout operation for photosensors 504, 542 would be identical to the steps just described with respect to photosensors 502, 522, except that the transfer gates 508, 536 would be activated by the even column transfer gate signals for Row<001> and Row<002>.

Finally, as shown after the fourth dashed line on FIG. 9, assuming the readout process of Rows<001> and <002> is complete, a new integration period is initiated for Rows <005> and <006>. Specifically, the photosensors and floating diffusion regions in these rows are both reset by holding down a reset signal (Reset) to activate the gates of reset transistors and by turning "on" the associated transfer gates for transfer transistors by pulsing the appropriate transfer gate signal (Row$_{odd}$ TX for the odd column pixels and Row$_{even}$ TX for the even column pixels). After the integration period for these rows, the signals generated by the photosensors in t Rows <005> and <006> may be read out as described above.

It should be understood that the method of operation just described would be repeated for each of the rows and columns of the array, and where the method was described for individual pixels only, this was for the sake of simplicity, and these steps would occur simultaneously for every other pixel in a row, and would then be repeated for the remainder of the pixels in the array in a row pair by row pair rolling fashion. In addition, this method is only exemplary, and the invention is not in any way limited to operation by the described method.

FIG. 10 illustrates a block diagram of an exemplary CMOS imager 300 having a pixel array 200 being constructed in accordance with one of the embodiments described above.

Pixel array 200 comprises a plurality of pixels arranged in a predetermined number of columns and rows (not shown). Attached to the array 200 is signal processing circuitry, as described herein, at least part of which may be formed in the substrate. The pixels of each row in array 200 are all turned on at the same time by a row select line, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel.

The CMOS imager 300 is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$), are read by a sample and hold circuit 265 associated with the column device 260. A differential signal ($V_{rst}-V_{sig}$) is produced by differential amplifier 267 for each pixel which is digitized by analog to digital converter 275 (ADC). The analog to digital converter 275 supplies the digitized pixel signals to an image processor 280 which forms a digital image.

Figure 11:
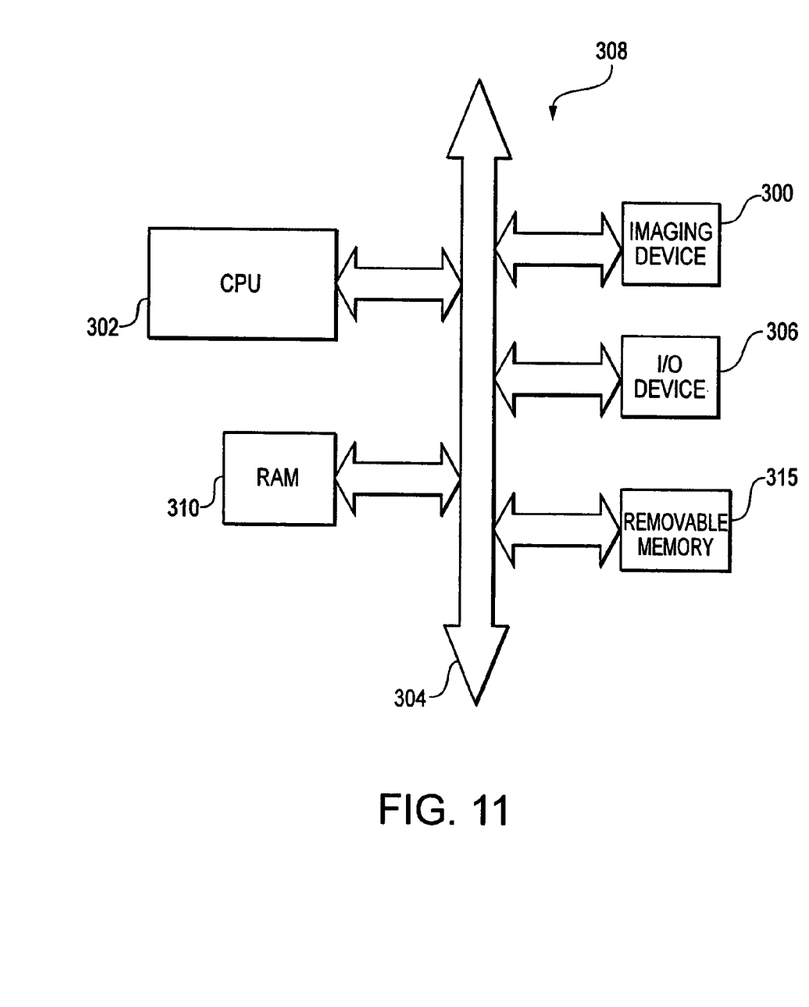
FIG. 11 is a schematic diagram of a processing system employing a CMOS imager constructed in accordance with the invention.

FIG. 11 shows a processor system 308, which includes an imager 300 constructed in accordance with an embodiment of the invention. The processor system 308 may be part of a digital camera or other imaging system. The imager 300 may receive control or other data from system 308. System 308 includes a processor 302 having a central processing unit (CPU) for image processing, or other image handling operations. The processor 302 communicates with various devices over a bus 304. Some of the devices connected to the bus 304 provide communication into and out of the system 308; an input/output (I/O) device 306 and imager 300 are such communication devices. Other devices connected to the bus 304 provide memory, for instance, a random access memory (RAM) 310 or a removable memory 315.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the invention is discussed only with reference to pixel arrays having a 2-way or 4-way sharing of component parts, other multi-way sharing pixel arrays are also intended to be within the scope of the invention. Additionally, any modifications, though presently unforeseeable, of the present invention that come within the spirit and scope of the following claims should be considered part of the present invention.

The invention claimed is:

1. A pixel array including a plurality of pixels arranged into a plurality of rows and columns, said array comprising:
    first, second, third and fourth pixels, each pixel having a respective first, second, third and fourth photosensor for generating photo-charges;
    a common storage node shared by the first, second, third, and fourth pixels for storing the generated photo-charges;
    a capacitor coupled to the common storage node for increasing the capacitance thereof; and
    a shared readout circuit connected to said common storage node.

2. The pixel array of claim 1, further comprising a reset transistor for resetting the charges stored at the common storage node.

3. The pixel array of claim 1, wherein the readout circuit includes at least one of a common source follower transistor having a gate connected to said common storage node and a common row select transistor for gating the output of said source follower transistor.

4. The pixel array of claim 3, wherein the readout circuit is constructed to produce first, second, third and fourth output signals representing a respective amount of charge generated by the first, second, third and fourth photosensors.

5. The pixel array of claim 1, wherein two of the first, second, third and fourth pixels are two adjacent pixels in a row of the array.

6. The pixel array of claim 5, wherein two of the first, second, third and fourth pixels are adjacent pixels in a column of the array.

7. The pixel array of claim 1, wherein the shared readout circuit is located in an active region located between a first and second pair of photosensors.

8. The pixel array of claim 7, wherein the first pair of photosensors comprises the first and second photosensors and wherein the second pair of photosensors comprises the third and fourth photosensors.

9. The pixel array of claim 7, wherein the capacitor is located at a clipped edge of one of the pairs of photosensors.

10. The pixel array of claim 1, further comprising respective first, second, third, and fourth transfer transistors for transferring charges from the respective first, second, third, and fourth photosensors to said common storage node.

11. The pixel array of claim 10, wherein the first, second, third, and fourth transfer transistors each comprise a transfer gate that is at least partially at an angle with respect to an associated photosensor.

12. An imager having a pixel array including plurality of pixels arranged in rows and columns, said array comprising:
    first, second, third, and fourth photosensors for generating photo-charges in response to applied light;
    a common storage node shared by the first, second, third, and fourth photosensors for storing the generated photo-charges;
    a capacitor coupled to the common storage node for increasing the capacitance thereof;
    a common reset transistor for resetting the charge at the common storage node; and
    a readout circuit comprising at least one common transistor for producing at least one signal representing an amount of charge stored at the common storage node, at least a portion of the readout circuit being located in an active region between the first, second, third, and fourth photosensors.

13. The imager of claim 12, wherein the first, second, third or fourth photosensors each comprise a photodiode.

14. The imager of claim 12, wherein the readout circuit is constructed to generate four readout signals representing the amount of charges respectively generated by each of the first, second, third and fourth photosensors.

15. The imager of claim 12, wherein the readout circuit is coupled to sample and hold circuitry comprising:
    a first set of sample and hold capacitors for storing signals output on a column line; and
    a second set of sample and hold capacitors for storing signals output on the column line.

16. The imager of claim 15, the sample and hold circuitry further comprising a switch for controlling the storage of incoming signals into either the first or the second set of capacitors.

17. An imager circuit comprising:
a first readout circuit including a first readout transistor for reading out a signal from each of a first plurality of pixels in an imager array, the array comprising a plurality of pixels arranged into columns and rows;
a second readout circuit including a second readout transistor for reading out a signal from each of a second plurality of pixels in the imager array;
a first transfer gate signal line for applying a first transfer gate signal to at least one transfer gate in each of the first and the second plurality of pixels; and
a second transfer gate signal line for applying a second transfer gate signal to at least one transfer gate in each of the first and the second plurality of pixels,
wherein the first transfer gate signal is applied to each of the transfer gates in an odd numbered column, and the second transfer gate signal is applied to each of the transfer gates in an even numbered column.

18. The circuit of claim 17, wherein the first plurality of pixels includes at least one pixel in a first row and at least one pixel in a second, adjacent row.

19. The circuit of claim 17, wherein the first and second plurality of pixels comprise at least two row adjacent pixels.

20. The circuit of claim 17, further comprising a column output line for reading out the pixel signals from each of the first and the second readout transistors.

21. The circuit of claim 20, further comprising at least two capacitors for accepting the pixel signals from the column output line, wherein the first capacitor accepts signals from the first plurality of pixels, and the second capacitor accepts a signals for the second plurality of pixels.

22. The circuit of claim 21, further comprising a switch to control the storage of pixels signals in the at least two capacitors.

23. A method of operating a pixel array comprising:
transferring charges generated from at least a first and a second photosensor of the pixel array to a first storage region;
transferring charges generated from at least a third and a fourth photosensor of the pixel array to a second storage region;
utilizing a common source follower transistor to generate and output a first, second, third, and fourth pixel signal to represent an amount of charge generated by the first, second, third, and fourth photosensors during an integration period;
utilizing a row select transistor to gate the output of said source follower transistor; and
activating a switch to control the storage of said first, second, third, and fourth pixel signals into either a first or a second set of sample and hold capacitors.

24. The method of claim 23, wherein the first and second storage regions comprise floating diffusion regions, each said floating diffusion region being electrically connected to a capacitor.

25. The method of claim 23, further comprising the act of resetting the charges stored at the first and second storage regions to create a reset condition.

26. The method of claim 25, further comprising the act of reading out a signal from the array representing the reset condition.

27. The method of claim 23, wherein the act of controlling storage comprises directing the output signals to one of a first and a second set of sample and hold capacitors.

28. The method of claim 23, wherein the charge from the first photosensor is transferred at a different time than the charge from the second photosensor, and the charge from the third photosensor is transferred at a different time than the charge from the fourth photosensor.

* * * * *